(12) United States Patent  
Zheng et al.

(10) Patent No.: US 9,352,957 B2  
(45) Date of Patent: May 31, 2016

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Chao Zheng, Shanghai (CN); Junde Ma, Shanghai (CN); Liangliang Guo, Shanghai (CN); Wei Wang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/809,642

(22) Filed: Jul. 27, 2015

(65) Prior Publication Data

US 2016/0031706 A1 Feb. 4, 2016

(30) Foreign Application Priority Data

Jul. 30, 2014 (CN) .......................... 2014 1 0370715

(51) Int. Cl.
*H01L 21/76* (2006.01)
*B81B 7/00* (2006.01)
*H01L 49/02* (2006.01)

(52) U.S. Cl.
CPC .............. *B81B 7/0038* (2013.01); *H01L 28/10* (2013.01)

(58) Field of Classification Search
CPC ....... H01L 23/26; H01L 23/10; B81B 7/0032; B81B 7/0038; B81B 7/0041
USPC .......... 438/52, 402, FOR. 144; 257/682, 914, 257/704, 710, 924, E23.128, 257/E21.5–E21.501, E23.18–E23.193
See application file for complete search history.

(56) References Cited

U.S. PATENT DOCUMENTS

| 7,187,123 B2 * | 3/2007 | MacPherson ....... H01L 27/3253 257/797 |
| 2012/0068300 A1 * | 3/2012 | Summers ............ B81C 1/00285 257/531 |

* cited by examiner

*Primary Examiner* — Jasmine Clark
(74) *Attorney, Agent, or Firm* — Innovation Counsel LLP

(57) ABSTRACT

A semiconductor device may include an enclosure structure. The semiconductor device may further include a getter for absorb gas molecules. The getter may be positioned (and enclosed) inside the enclosure structure and may overlap a first portion of a surface of the enclosure structure. The semiconductor device may further include an inductor. The inductor may be positioned (and enclosed) inside the enclosure structure and may overlap a second portion of the surface of the enclosure structure without overlapping the getter in a direction perpendicular to the first surface of the enclosure structure.

9 Claims, 11 Drawing Sheets

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201410370715.6, filed on Jul. 30, 2014; the Chinese Patent Application is incorporated herein by reference in its entirety.

BACKGROUND OF THE INVENTION

The present invention is related to a semiconductor device, a method for manufacturing the semiconductor device, and an electronic device that includes the semiconductor device.

A semiconductor device may include elements that need to operate in a vacuum environment. For example, the elements may include one or more microelectromechanical systems (MEMS) components. The semiconductor device may include a substantially vacuum structure for accommodating the elements. In order to maintain the vacuum environment, the substantially vacuum structure may include a getter that may combine with and/or absorb gas molecules that emerge in the vacuum environment.

If the getter is undesirably coupled with another element of the substantially vacuum structure, e.g., through inductive coupling, the performance of one or more of the coupled elements may be unsatisfactory. As a result, the quality of the semiconductor device and the related manufacturing yield may be unsatisfactory.

SUMMARY

An embodiment of the present invention may be related to a semiconductor device. The semiconductor device may include an enclosure structure. The semiconductor device may further include a getter for absorb gas molecules. The getter may be positioned (and enclosed) inside the enclosure structure and may overlap a first portion of a first surface of the enclosure structure. The semiconductor device may further include an inductor. The inductor may be positioned (and enclosed) inside the enclosure structure and may overlap a second portion of the first surface of the enclosure structure without overlapping the getter in a direction perpendicular to the first surface of the enclosure structure.

A first side of the getter may be positioned between the first surface of the enclosure structure and a second side of the getter. A surface roughness of the second side of the getter may be greater than a surface roughness of the first side of the getter. The second side of the getter may have a first protrusion and a second protrusion. The first protrusion may be taller than the second protrusion with respect to the first side of the getter. A surface roughness of the second side of the getter may be greater than a surface roughness of the first surface of the enclosure structure.

A first portion of the getter may extend at an angle with respect to a second portion of the getter. The magnitude of the angle may be greater than 0 degree and less than 180 degrees. A surface roughness of the second portion of the getter may be greater than a surface roughness of the first surface of the enclosure structure. The first portion of the getter may extend parallel to the first surface of the enclosure structure. The second portion of the getter may extend parallel to a second surface of the enclosure structure.

The enclosure structure may include a first member and a second member. The first member may be formed of a first material. The second member may be formed of a second material different from the first material. The getter (e.g., the second portion of the getter) may directly contact both the first member and the second member.

The enclosure structure may enclose a first space and a second space connected to the first space. The first space and the second space may form a cavity of the enclosure structure. The inductor may be positioned in (or inside) the first space. The getter may be positioned in (or inside) the second space. The first space may be wider than the second space in a direction parallel to the first surface of the enclosure structure.

An embodiment of the present invention may be related to a method for manufacturing a semiconductor device. The method may include the following steps: providing a first substrate structure that may have a trench; providing a getter in the trench, such that the getter may overlap a first portion of a bottom surface of the trench; and after the getter has been provided in the trench, combining the first substrate structure with a second substrate structure that includes an inductor, such that inductor may overlap a second portion of the bottom surface of the trench without overlapping the getter in a direction perpendicular to the bottom surface of the trench.

The method may include the following step: forming protrusions at a first side of the getter. A second side of the getter may be positioned between the first side of the getter and the bottom surface of the trench.

The method may include the following steps: providing a getter material layer that may cover a bottom surface of the trench; performing a roughening treatment on the getter material layer; and after the roughening treatment, etching the getter material layer to form the getter. The getter material layer may cover a side surface of the trench. The getter may overlap the side surface of the trench in a direction perpendicular to the side surface of the trench.

The method may include following step: after the getter may have been provided in the trench and before the combining the first substrate structure with the second substrate structure, performing a cleaning process on the first substrate structure.

The first substrate structure may include a substrate member and a mask member connected to the substrate member. The substrate member may be formed of a first material. The mask member may be formed of a second material different from the first material. The getter may directly contact both the substrate member and the mask member.

The method may include the following steps: providing a getter material member in the trench, such that a portion of the getter material member may cover a side surface of the trench and a second portion of the bottom surface of the trench; and removing the portion of the getter material member to obtain the getter.

The method may include the following steps: providing a mask layer on a composite structure that may include a substrate material member, a mask member positioned on the substrate material member, and a bonding material member positioned on the mask member; etching the substrate material member through the mask layer to obtain the first substrate structure, wherein the mask layer may expose the trench; providing a getter material layer that may cover the mask layer and the bottom surface of the trench; removing the mask layer and a portion of the getter material layer that may cover the mask layer to form a getter material member, wherein a first portion of the getter material member may cover a second portion of the bottom surface of the trench, and wherein a portion of the mask member may be positioned between the first portion of the getter material member and a second portion of the getter material member; and removing at least the first portion of the getter material member and the second portion of the getter material member to obtain the getter.

The mask layer may directly contact both the mask member and the bonding material member before the mask layer is removed.

An embodiment of the present invention may be related to an electronic device. The electronic device may include the following elements: an electronic component; and a semiconductor device electrically connected to the electronic component. The semiconductor device may include the following elements: an enclosure structure; a getter positioned inside the enclosure structure, overlapping a surface of the enclosure structure, and configured to absorb gas molecules; and an inductor positioned inside the enclosure structure and overlapping the surface of the enclosure structure without overlapping the getter in a direction perpendicular to the surface of the enclosure structure.

According to embodiments of the invention, in semiconductor devices, undesirable coupling between components (e.g., between an inductors and getters) may be minimized or substantially prevented, vacuum may be substantially effectively maintained, and/or substantially robust bonding may be ensured. Advantageously, satisfactory quality of the semiconductor devices and a satisfactory yield of the manufacturing process may be substantially attained.

The above summary is related to some of many embodiments of the invention disclosed herein and is not intended to limit the scope of the invention.

BRIEF DESCRIPTION OF THE DRAWINGS

FIG. 3K shows a schematic diagram (e.g., a schematic cross-sectional view) that illustrates elements and/or structures in a semiconductor device in accordance with one or more embodiments of the present invention.

FIG. 5F shows a schematic diagram (e.g., a schematic cross-sectional view) that illustrates elements and/or structures in a semiconductor device in accordance with one or more embodiments of the present invention.

DETAILED DESCRIPTION

Figure 1A:
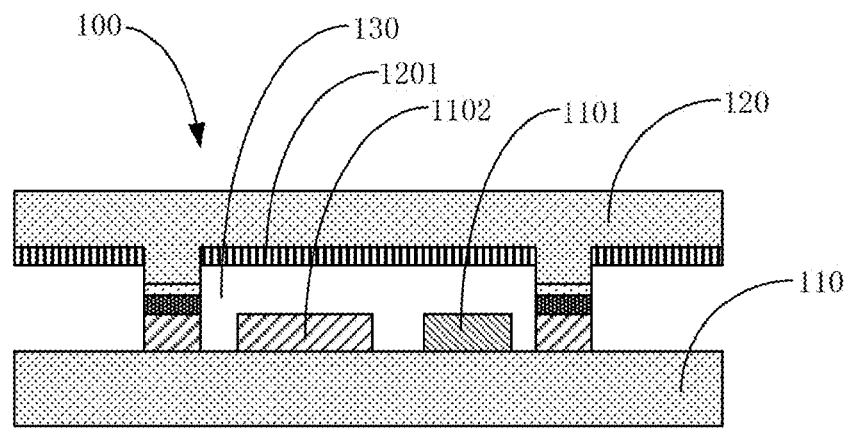
FIG. 1A shows a schematic diagram (e.g., a schematic cross-sectional view) that illustrates elements and/or structures in a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1B:
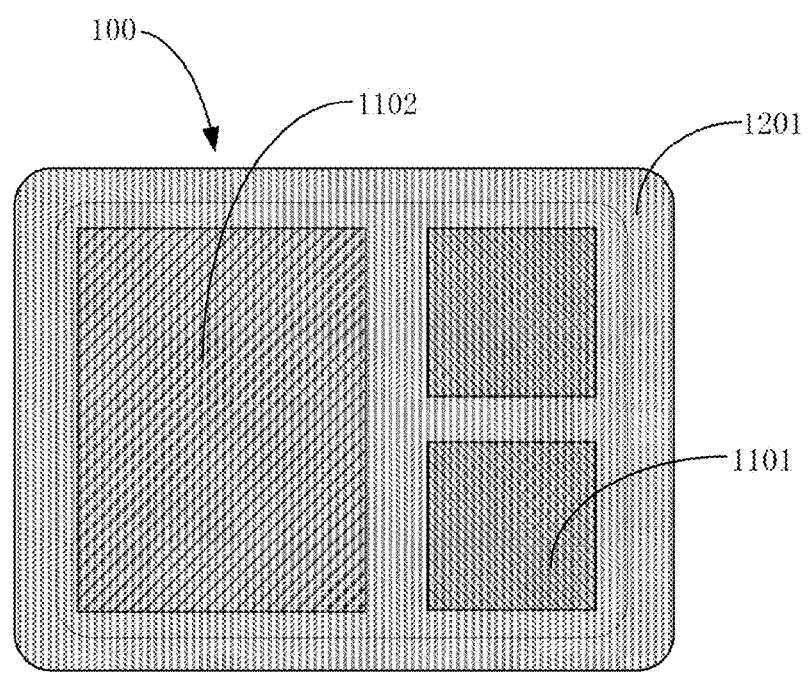
FIG. 1B shows a schematic diagram (e.g., a schematic layout view) that illustrates elements and/or structures in a semiconductor device in accordance with one or more embodiments of the present invention.

FIG. 1A shows a schematic diagram (e.g., a schematic cross-sectional view) that illustrates elements and/or structures in a semiconductor device 100 in accordance with one or more embodiments of the present invention. FIG. 1B shows a schematic diagram (e.g., a schematic layout view) that illustrates elements and/or structures in the semiconductor device 100 in accordance with one or more embodiments of the present invention. The semiconductor device 100 may include a substrate 120, a getter 1201 positioned on the substrate 120, a substrate 110 combined with the substrate 120, an electronic component 1101 (e.g., a MEMS component) positioned on the substrate 110, and an inductor 1102 positioned on the substrate 110.

A cavity 130 may be formed in the combination of the substrates 120 and 110. The getter 1201, the electronic component 1101, and the inductor 1102 may be positioned (and enclosed) inside the cavity 130. The getter 1201 may be formed of, for example, titanium. The getter 1201 may absorb and/or combine with gas molecules that emerge in the cavity 130, such that the cavity 130 may be maintained substantially vacuum.

The getter 1201 may be sufficiently spaced from the inductor 1102. Advantageously, undesirable coupling between the getter 1201 and the inductor may be minimized or substantially prevented.

Figure 2A:
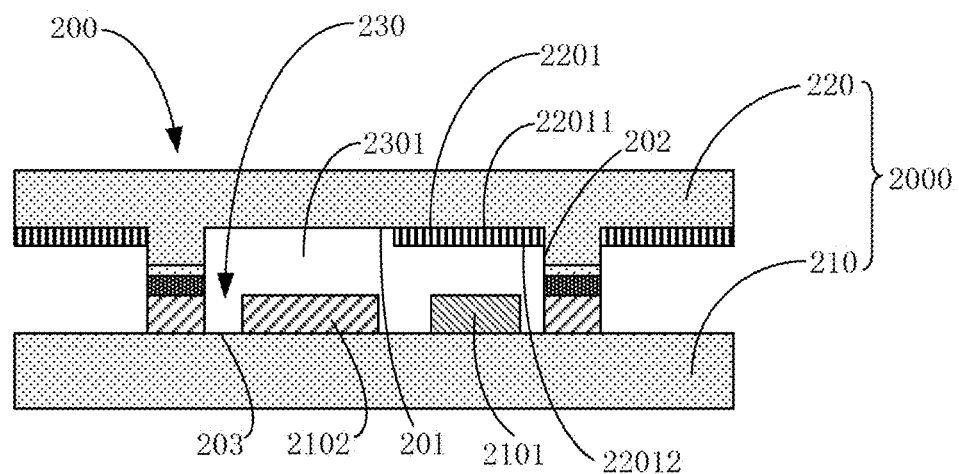
FIG. 2A shows a schematic diagram (e.g., a schematic cross-sectional view) that illustrates elements and/or structures in a semiconductor device in accordance with one or more embodiments of the present invention.
Figure 2B:
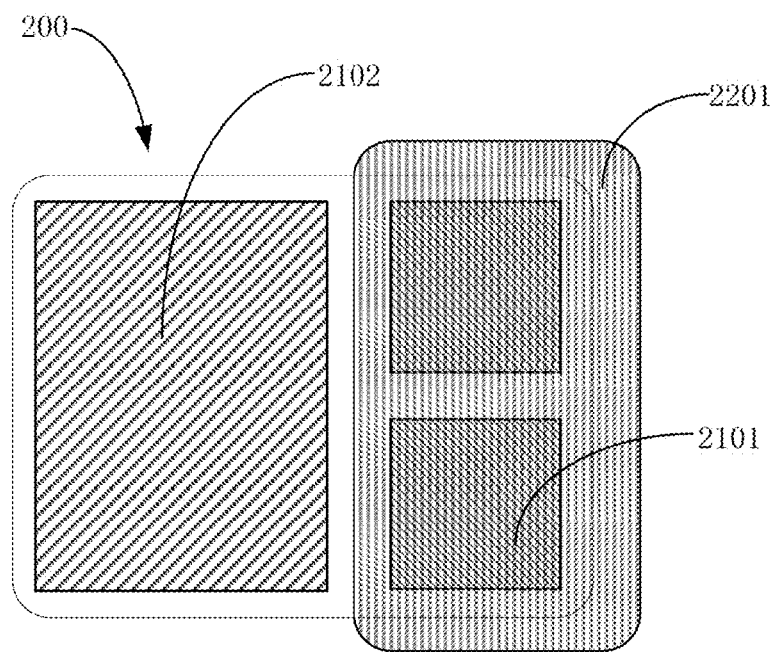
FIG. 2B shows a schematic diagram (e.g., a schematic layout view) that illustrates elements and/or structures in a semiconductor device in accordance with one or more embodiments of the present invention.
Figure 2C:
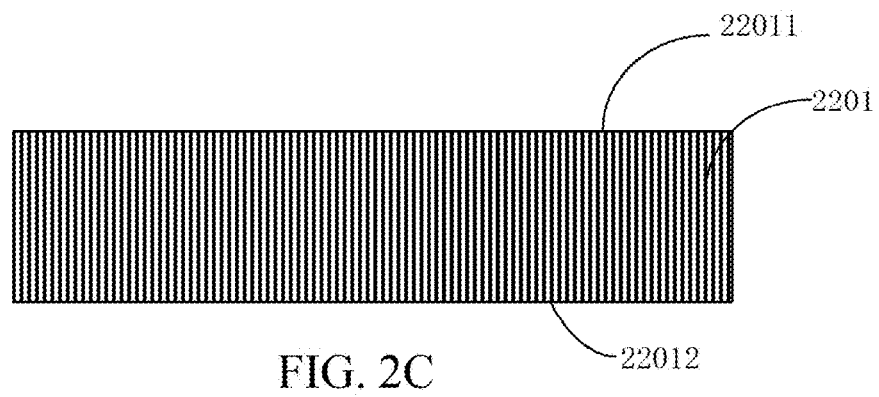
FIG. 2C shows a schematic diagram (e.g., a schematic cross-sectional view) that illustrates a getter of a semiconductor device in accordance with one or more embodiments of the present invention.
Figure 2D:
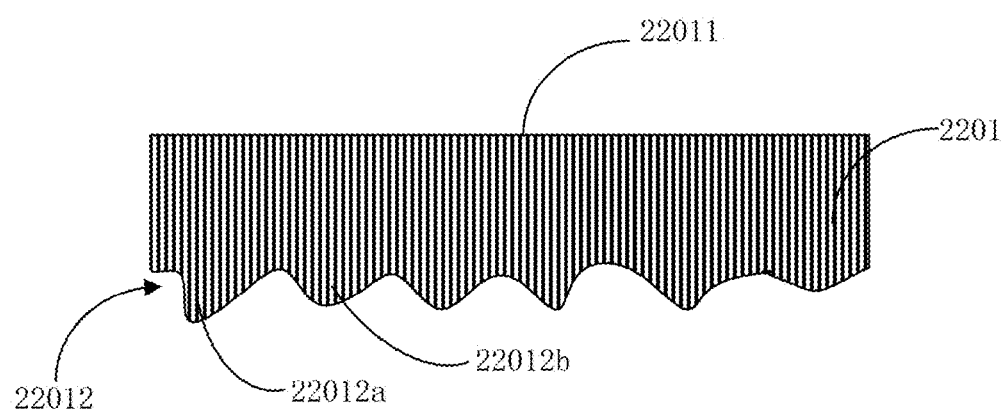
FIG. 2D shows a schematic diagram (e.g., a schematic cross-sectional view) that illustrates a getter of a semiconductor device in accordance with one or more embodiments of the present invention.

FIG. 2A shows a schematic diagram (e.g., a schematic cross-sectional view) that illustrates elements and/or structures in a semiconductor device 200 in accordance with one or more embodiments of the present invention. FIG. 3K shows a schematic diagram (e.g., a schematic cross-sectional view) that illustrates elements and/or structures in the semiconductor device 200 in accordance with one or more embodiments of the present invention. FIG. 5F shows a schematic diagram (e.g., a schematic cross-sectional view) that illustrates elements and/or structures in the semiconductor device 200 in accordance with one or more embodiments of the present invention. FIG. 2B shows a schematic diagram (e.g., a schematic layout view) that illustrates elements and/or structures in the semiconductor device 200 in accordance with one or more embodiments of the present invention. FIG. 2C shows a schematic diagram (e.g., a schematic cross-sectional view) that illustrates a getter 2201 of the semiconductor device 200 in accordance with one or more embodiments of the present invention. FIG. 2D shows a schematic diagram (e.g., a schematic cross-sectional view) that illustrates the getter 2201 of the semiconductor device 200 in accordance with one or more embodiments of the present invention.

Referring to FIG. 2A, FIG. 2B, FIG. 3K, and/or FIG. 5F, the semiconductor device 200 may include an enclosure structure 2000. The enclosure structure 200 may include a substrate structure 220 and a substrate structure 210. A cavity 230 may be formed between the substrate structure 220 and the substrate structure 210.

The semiconductor device 200 may further include a getter 2201. The getter 2201 may be positioned (and enclosed) inside the cavity 230 of the enclosure structure 2000. The getter 2201 may be positioned inside a trench 2301 of the substrate structure 220. The getter 2201 may overlap, directly contacts, and/or be positioned on a first portion (e.g., right portion illustrated in FIG. 2A) of a surface 201 (of the substrate structure 220) of the enclosure structure 2000. The getter 2201 may be configured to absorb gas molecules, such that the cavity 230 may remain substantial vacuum. The getter 2201 may be formed of, for example, titanium.

The semiconductor device may further include an inductor 2102. The inductor 2102 may be positioned (and enclosed) inside the cavity 230 of the enclosure structure 2000, may be positioned on (and/or directly contact) a surface 203 of the enclosure structure 2000, may be spaced from the surface 201 of the enclosure structure 2000, and may overlap a second portion (e.g., left portion illustrated in FIG. 2A) of the surface 201 of the enclosure structure 2000 without overlapping the getter 2201 in a direction perpendicular to the surface 201 of the enclosure structure 2000. The surface 203 of the enclosure structure 2000 may be connected through a surface 202 of the enclosure structure 2000 to the surface 201 of the enclosure structure 2000. According to embodiments of the invention, the inductor 2102 may be substantially distant from the getter 2201 and/or may not substantially overlap the getter 2201. Advantageously, undesirable coupling between the inductor 2102 and the getter 2201 may be minimized or substantially prevented.

The semiconductor device may further include an electronic component 2101. The electronic component 2101 may be positioned (and enclosed) inside the cavity 230 of the enclosure structure 2000, may be positioned on (and/or directly contact) the surface 203 of the enclosure structure 2000, may be spaced from the surface 201 of the enclosure structure 2000, and may overlap the getter 2201 in the direction perpendicular to the surface 201 of the enclosure structure 2000. For example, the electronic component 2101 may be/include a MEMS component, an application-specific integrated circuit (ASIC) element, and/or one or more other elements.

The inductor 2102 and the electronic component 2101 may be positioned on (and/or directly contact) the substrate structure 210. One or more alternative or additional elements may be positioned on the substrate structure 210.

A side 22011 of the getter 2201 may be positioned between the surface 201 of the enclosure structure 2000 and a side 22012 of the getter 2201.

Referring to FIG. 2C, the surface roughness of the side 22012 of the getter 2201 may be substantially equal to the surface roughness of the side 22011 of the getter 2201.

Referring to FIG. 2D, a surface roughness of the side 22012 of the getter 2201 may be greater than a surface roughness of the side 22011 of the getter 2201. A surface roughness of one or more other sides of the getter 2201 also may be greater than a surface roughness of the side 22011 of the getter 2201. The side 22012 of the getter 2201 may have a protrusion 22012a and a protrusion 22012b. The protrusion 22012a may be taller than the protrusion 22012b with respect to the side 22011 of the getter 2201. A surface roughness of the side 22012 of the getter 2201 may be greater than a surface roughness of the surface 201 of the enclosure structure 2000. The extra surface roughness, the protrusions, and/or the protrusion tallness difference may provide a large contact area for gas molecules and/or may facilitate contact between gas molecules and the getter 2201. Advantageously, the getter 2201 may absorb gas molecule efficiently and/or effectively.

Referring to FIG. 3K, a portion 2201a of the getter 2201 may extend at an angle with respect to a portion 2201b of the getter 2201. The magnitude of the angle may be greater than 0 degree and less than 180 degrees, e.g., about 90 degrees. The portion 2201a of the getter 2201 may extend parallel to the surface 201 of the enclosure structure 2000. The portion 2201b of the getter 2201 may extend parallel to the surface 202 of the enclosure structure 2000. Referring to FIG. 5E, a surface roughness of the portion 2201b of the getter 2201 may be greater than a surface roughness of the surface 201 of the enclosure structure 2000. The multiple portions of the getter 2201 and/or the extra surface roughness of the getter 2201 may provide a substantially large contact area for gas molecules and therefore may advantageously enable the getter 2201 to absorb gas molecules efficiently and/or effectively.

Referring to FIG. 3K, the enclosure structure 2000 may include a substrate member 220a and a mask member 221. The substrate member 220a may be primarily formed of a first material, e.g., silicon. One or more active, passive, conductive, and/or insulating elements may be included and/or embedded in the substrate member 220a. The mask member 221 may be primarily formed of a second material, e.g., silicon oxide, different from the first material. The getter 2201 (e.g., the portion 2201b of the getter 2201) may directly contact both the substrate member 220a and the mask member 221.

Referring to FIG. 3K, the enclosure structure 2000 may enclose a first space (e.g., the upper space of the cavity 230 illustrated in FIG. 3K) and a second space (e.g., the lower space of the cavity 230 illustrated in FIG. 3K) connected to the first space. The first space and the second space may form the cavity 230 of the enclosure structure 2000. The inductor 2102 may be positioned in (or inside) the first space. The getter 2201 may be positioned in (or inside) the second space. The first space may be wider than the second space in a direction parallel to the surface 201 of the enclosure structure 2000. The relative wide second space may enable a sufficient distance between the inductor 2102 and the getter 2201; advantageously, undesirable coupling between the inductor 2102 and the getter 2201 may be minimized or substantially prevented. Alternatively or additionally, the relatively narrow first space may facilitate concentration of gas molecules in the first space; advantageously, the getter 2201 may efficiently and/or effectively absorb gas molecules.

FIG. 3A, FIG. 3B, FIG. 3C, FIG. 3D, FIG. 3E, FIG. 3F, FIG. 3G, FIG. 3H, FIG. 3I, FIG. 3J, and FIG. 3K show schematic diagrams (e.g., schematic cross-sectional views) that illustrate elements and/or structures formed in a method for manufacturing the semiconductor device 200 in accordance with one or more embodiments of the present invention. FIG. 4 shows a flowchart that illustrates steps in a method for manufacturing the semiconductor device 200 in accordance with one or more embodiments of the present invention.

Referring to FIG. 4, the method may include steps 401, 402, and 403.

Referring to FIG. 4, FIG. 3A, FIG. 3B, FIG. 3C, FIG. 3D, and FIG. 3E, the step 401 may include providing a substrate structure 220 that has a trench 2301. The substrate structure 220 may include a substrate member 220a, a mask member 221, and a bonding material member 222. The substrate member 220a may be primarily formed of, for example, silicon. The substrate member 220a may include one or more embedded elements, which may be formed of one or more other materials. The mask member 221 may be a hard mask and may be formed of one or more of silicon oxide, etc. The bonding material member 222 may be formed of one or more of germanium, etc.

Figure 3A:
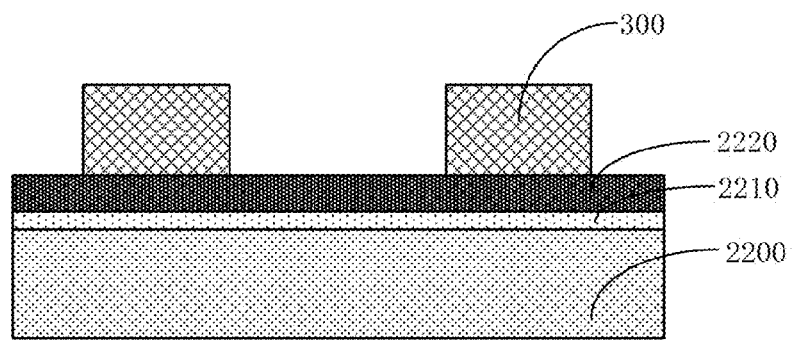
FIG. 3A, FIG. 3B, FIG. 3C, FIG. 3D, FIG. 3E, FIG. 3F, FIG. 3G, FIG. 3H, FIG. 3I, FIG. 3J, and FIG. 3K show schematic diagrams (e.g., schematic cross-sectional views) that illustrate elements and/or structures formed in a method for manufacturing a semiconductor device in accordance with one or more embodiments of the present invention.
Figure 4:
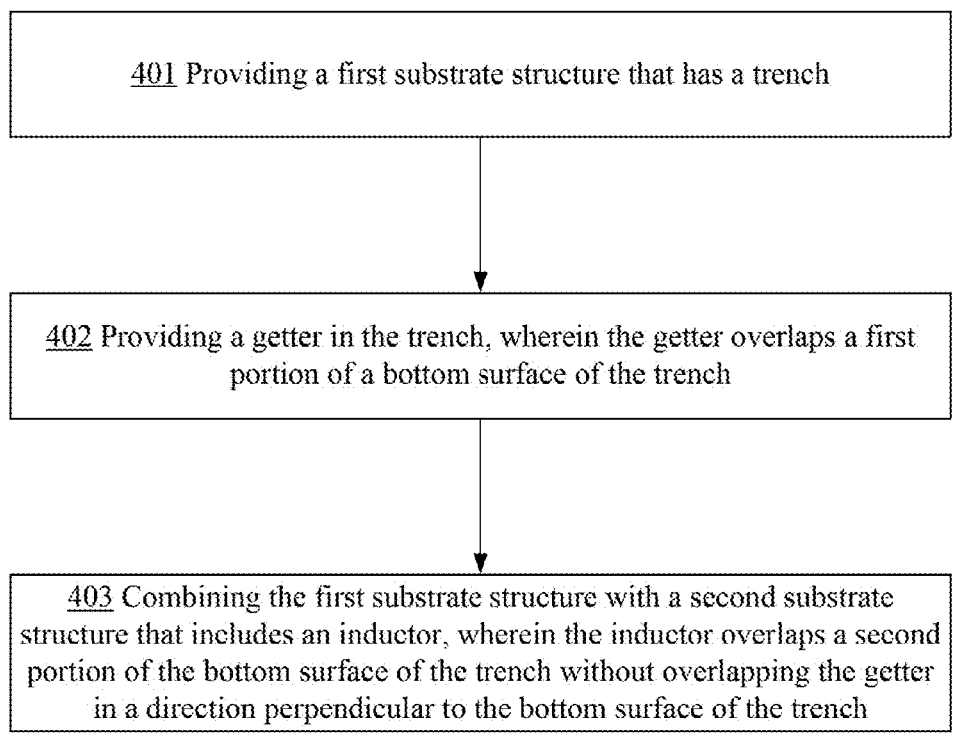
FIG. 4 shows a flowchart that illustrates steps in a method for manufacturing a semiconductor device in accordance with one or more embodiments of the present invention.

Referring to FIG. 3A, the step 401 may include the following sub-steps: providing a first composite structure, which may include a substrate material member 2200, a mask material layer 2210 covering the substrate material member 2200, and a bonding material layer 2220 covering the mask material layer 2210; and providing a mask 300 on the first composite structure, wherein the mask 300 may have an opening that exposes a portion of the bonding material layer 2220. The mask 300 may be formed of one or more of a photoresist material, etc. and may be formed through a lithography process.

Figure 3B:
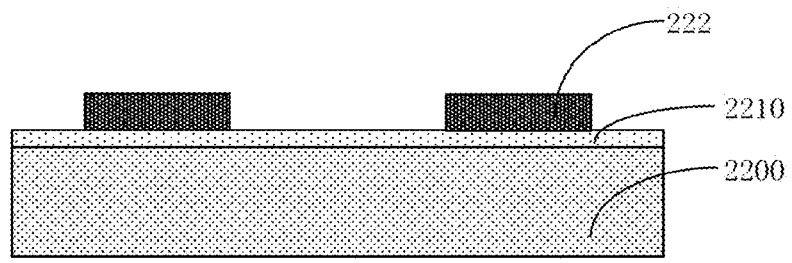

Referring to FIG. 3A and FIG. 3B, the step 401 may include the following sub-steps: removing (e.g., by performing an etching process through the opening of the mask 300) the exposed portion of the bonding material layer 2220 to form the bonding material member 222 and to form a second composite structure, which may include the substrate material member 2200, the mask material layer 2210 covering the substrate material member 2200, and the bonding material member 222 positioned on the mask material layer 2210; and removing the mask 300.

Figure 3C:
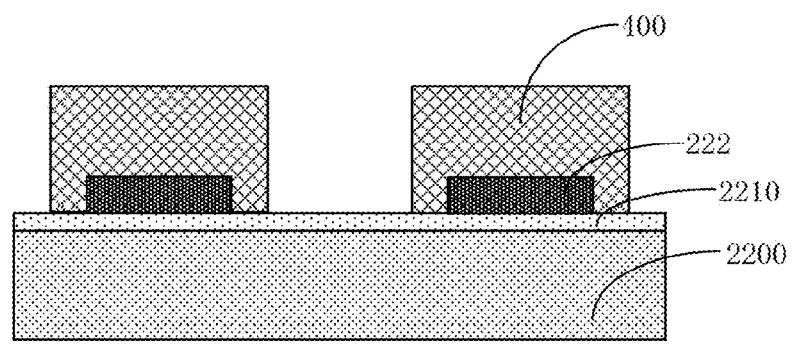

Referring to FIG. 3B and FIG. 3C, the step 401 may include the following sub-steps: providing a mask 400 on the second composite structure, wherein the mask 400 may substantially cover at least three sides of the bonding material member 222 and may have an opening that exposes a portion of the mask material layer 2210. The mask 400 may directly contact both the mask material layer 2210 and the bonding material member 222. The mask 400 may directly contact three, four, or five sides of the bonding material member 222 and may effectively protect the bonding material member 222. The mask 400 may be formed of one or more of a photoresist material, etc. and may be formed through a lithography process.

Figure 3D:
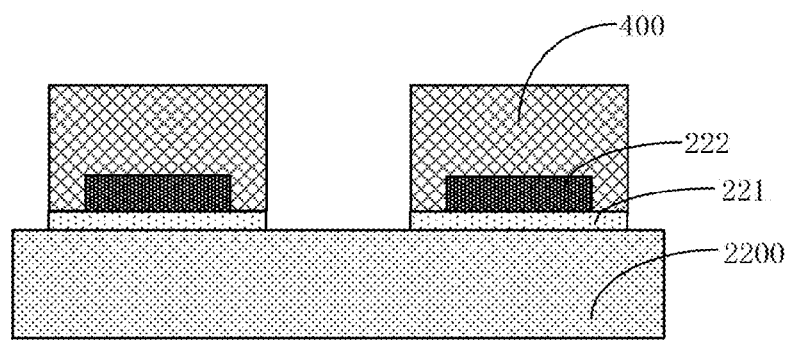

Referring to FIG. 3C and FIG. 3D, the step 401 may include the following sub-step: removing (e.g., by performing a dry etching process through the opening of the mask 400) the exposed portion of the mask material layer 2210 to form the mask member 222 and to form a third composite structure, which may include the substrate material member 2200, the mask member 221 positioned on the substrate material member 2200, and the bonding material member 222 positioned on the mask member 2210. The mask 400 may substantially cover both the bonding material member 222 and the mask member 2210 and may expose a portion of the substrate material member 2200. In this sub-step, an alignment pattern associated with the mask 300 also may be removed. The material of the alignment pattern may be the same as the material of the bonding material member 222.

Figure 3E:
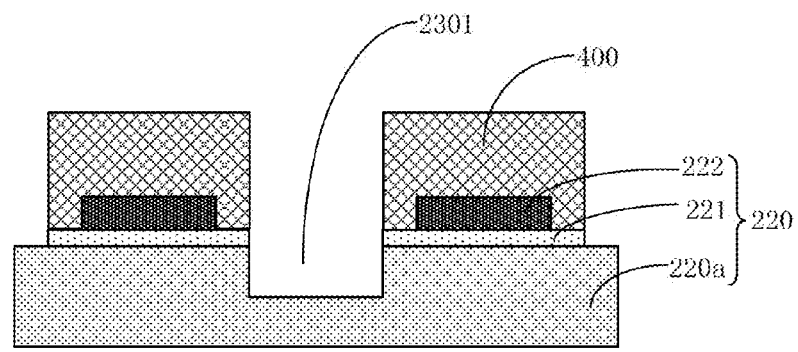

Referring to FIG. 3D and FIG. 3E, the step 401 may include the following sub-step: removing (e.g., by performing an etching process through the opening of the mask 400 and through an opening of the mask member 221) the exposed portion of the substrate material member 2200 to form the substrate structure 220, which may have the trench 2301. The mask 400 may remain on the substrate structure 220 and may expose the trench 2301. The mask 400 may directly contact both the mask member 221 and the bonding material member 222. The exposed portion of the substrate material member 2200 may be removed through one or more of a deep reactive-ion etching (DRIE) process, etc.

In the process of forming the substrate structure 220, the use of multiple masks, including the mask 300 and the mask 400 (which protects the bonding material member 222), may substantially ensure structure integrity of the bonding material member 222. Advantageously, the bonding material member 222 may optimize a subsequent structure bonding (or combination) process, such that a robust structure of the semiconductor device 200 may be attained.

In an embodiment, the substrate structure 220 may not include the mask member 221 and the bonding material member 222, and a single mask may be used for forming the trench 2301.

In an embodiment, a single mask may be used for forming one or more of the trench 2301, the mask member 221, and the bonding material member 222.

Referring to FIG. 4, FIG. 3E, FIG. 3F, FIG. 3G, FIG. 3H, FIG. 3I, and FIG. 3J, subsequent to the step 401, the step 402 may include providing a getter 2201 in the trench 2301, wherein the getter overlaps a first portion of the bottom surface 201 of the trench of the trench 2301.

Figure 3F:
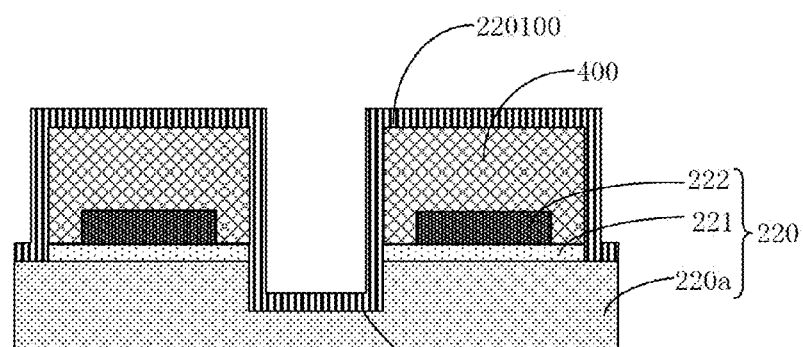

Referring to FIG. 3E and FIG. 3F, the step 402 may include the following sub-step: providing a getter material layer 220100 that may cover the mask 400 and the bottom surface 201 of the trench 2301. The getter material layer 220100 may be formed through one or more of titanium, etc. and may be formed through one or more of a deposition process, etc.

Figure 3G:
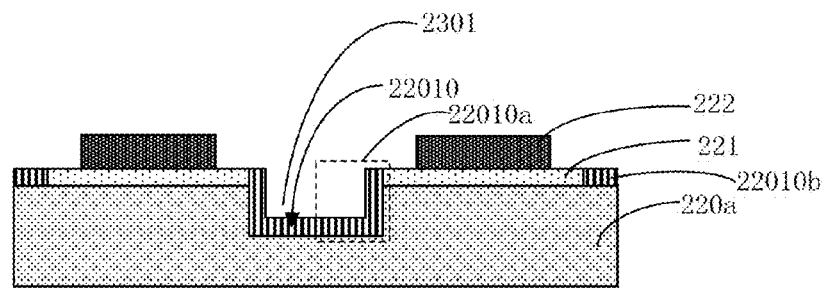

Referring to FIG. 3F and FIG. 3G, the step 402 may include the following step: removing (e.g., through a lift-off process) the mask 400 and a portion of the getter material layer 220100 that covers (and/or is attached to) the mask 400 to form a getter material member 22010. A portion 22010a of the getter material member 22010 may cover a portion of the bottom surface 201 of the trench 2301 (and may cover a side surface of the trench 2301). A portion of the mask member 221 may be positioned between the portion 22010a of the getter material member 22010 and a portion 22010b of the getter material member 22010. A surface roughening process may be performed on the getter material member 22010. The surface roughening process may include one or more of a dry etching process, a wet etching process, etc.

Figure 3H:
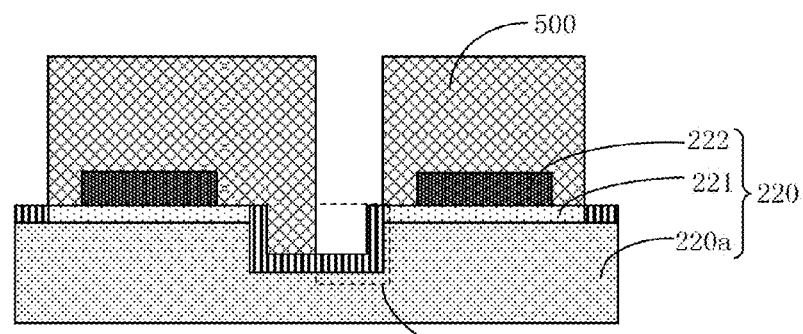

Referring to FIG. 3G and FIG. 3H, the step 402 may include the following step: forming a mask 500 on the substrate structure 220, wherein the mask 500 may partially cover the getter material member 22010 and may expose at least the portions 22010a and 22010b of the getter material member 22010. The mask 500 may be formed of one or more of a photoresist material, etc. and may be formed through one or more of a lithography process, etc.

Figure 3I:
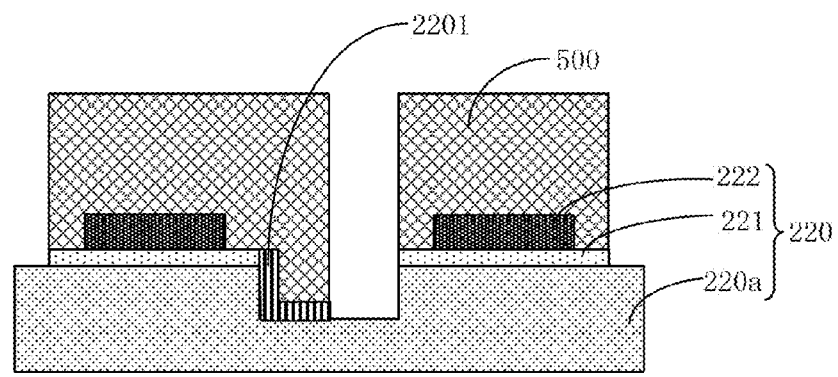

Referring to FIG. 3H and FIG. 3I, the step 402 may include the following step: removing (e.g., by performing a wet etching process through the mask 500) at least the portions 22010a and 22010b the getter material member 22010 to obtain the getter 2201, which may overlap a portion of the bottom surface 201 of the trench 2301 (and may overlap a side surface 202 of the trench 2301).

Figure 3J:
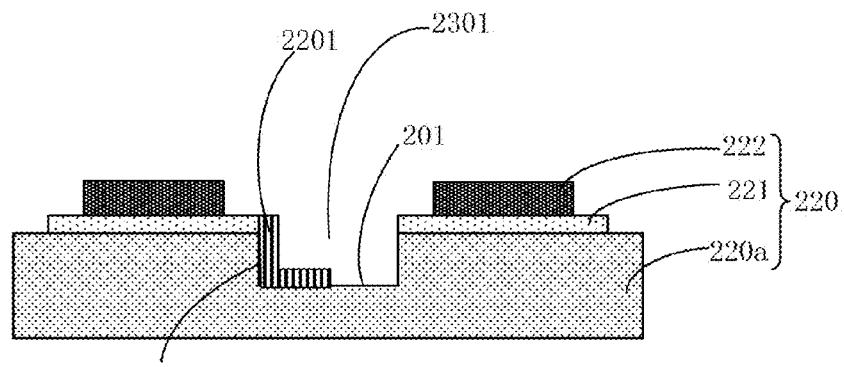
Figure 3K:
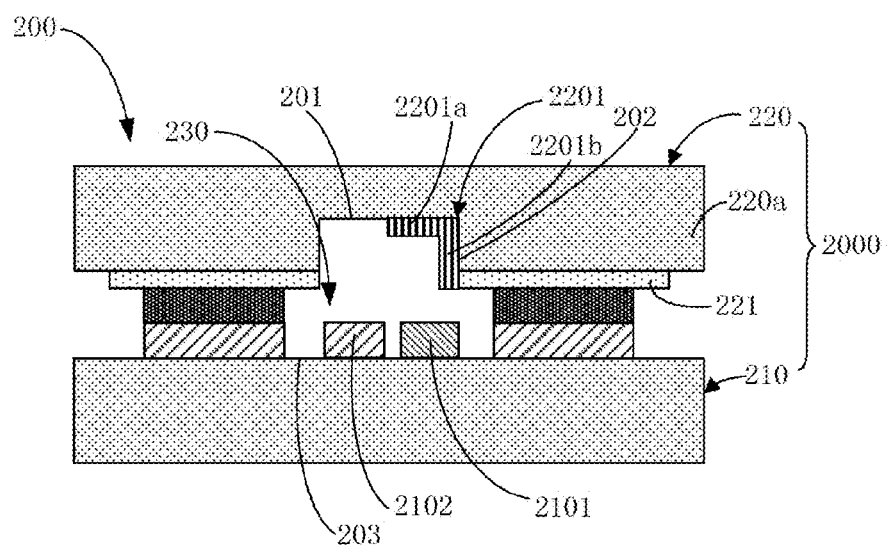

Referring to FIG. 3I and FIG. 3J, the step 402 may include the following steps: removing the mask 500; and performing a cleaning process on the substrate structure 220.

Referring to FIG. 4 and FIG. 3K, subsequent to the step 402, the step 403 may include combining the substrate structure 220 with a substrate structure 210 that includes an electronic component 2101 and an inductor 2102 to form an enclosure structure 2000 that encloses the getter 2201, the electronic component 2101, and the inductor 2102, such that inductor 2102 may overlap another portion of the bottom surface 201 of the trench 2301 without overlapping the getter 2201 in a direction perpendicular to the bottom surface 201 of the trench 2301. The method and the resulted enclosure structure 2000 may have one or more of the features and advantages associated with the semiconductor device 200 discussed above.

According to embodiments of the invention, undesirable coupling between the getter 2201 and the inductor 2102 may be minimized or substantially prevented, molecular absorption capability of the getter 2201 may be optimized, and/or the substrate structures 220 and 201 may be optimally bonded through the bonding material member 222. Advantageously, satisfactory quality of the semiconductor device 200 and satisfactory manufacturing yield associated with the semiconductor device may be substantially attained.

FIG. 5A, FIG. 5B, FIG. 5C, FIG. 5D, FIG. 5E, and FIG. 5F show schematic diagrams (e.g., schematic cross-sectional views) that illustrate elements and/or structures formed in a method for manufacturing a semiconductor device in accordance with one or more embodiments of the present invention. FIG. 6 shows a flowchart that illustrates steps in a method for manufacturing a semiconductor device in accordance with one or more embodiments of the present invention.

Referring to FIG. 6, the method may include steps 601, 602, 603, 604, 605, and 606.

Figure 5A:
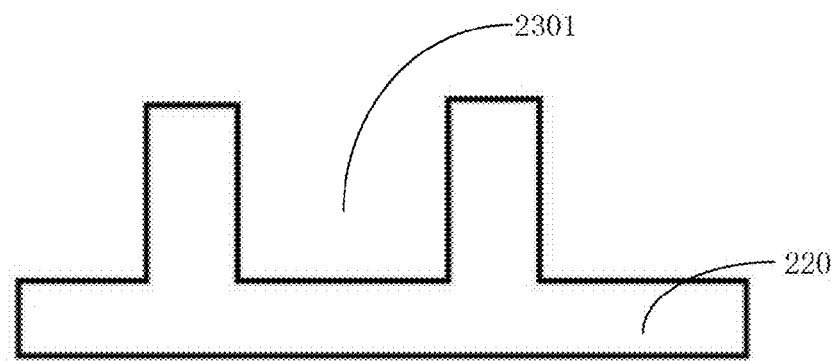
FIG. 5A, FIG. 5B, FIG. 5C, FIG. 5D, FIG. 5E, and FIG. 5F show schematic diagrams (e.g., schematic cross-sectional views) that illustrate elements and/or structures formed in a method for manufacturing a semiconductor device in accordance with one or more embodiments of the present invention.
Figure 6:
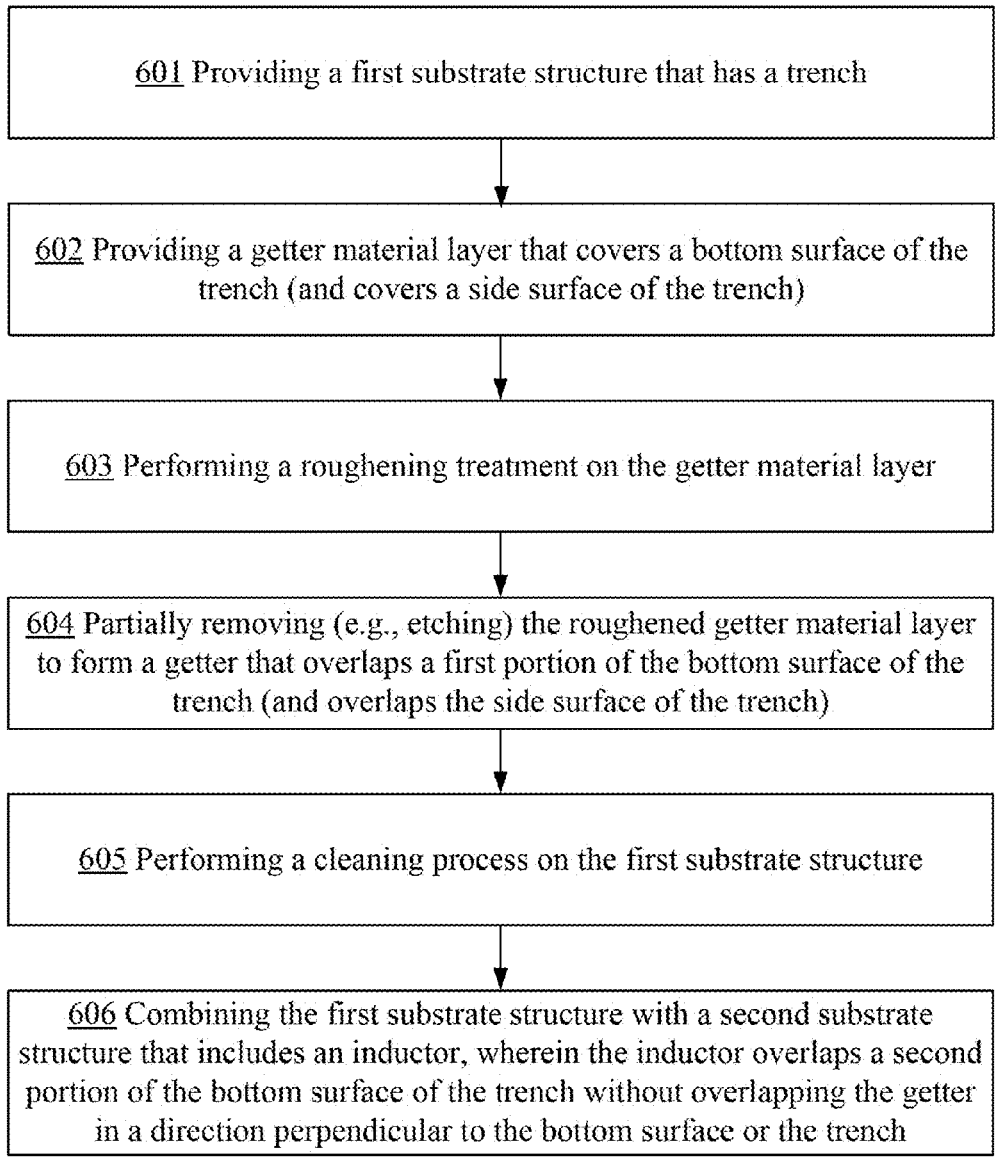
FIG. 6 shows a flowchart that illustrates steps in a method for manufacturing a semiconductor device in accordance with one or more embodiments of the present invention.

Referring to FIG. 6 and FIG. 5A, the step 601 may include providing a substrate structure 220 that has a trench 2301. The trench 2301 may be formed through one or more of a dry etching process, a wet etching process, etc.

Figure 5B:
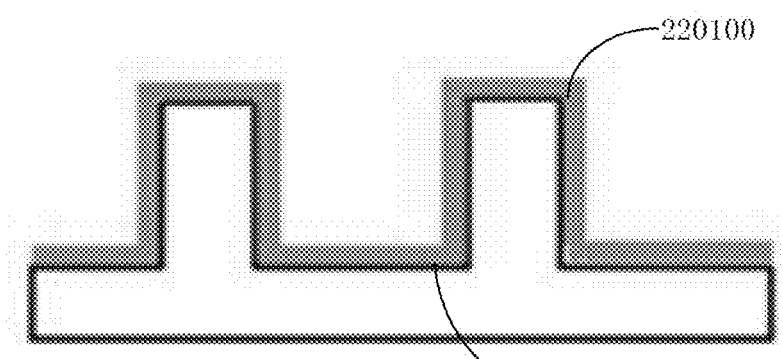

Referring to FIG. 6, FIG. 5A, and FIG. 5B, subsequent to the step 601, the step 602 may include providing a getter material layer 220100 that covers a bottom surface 201 of the trench 2301 (and covers one or more side surfaces of the trench 2301) through one or more of a deposition process, etc. The getter material layer 220100 may be formed of one or more of titanium, etc.

Figure 5C:
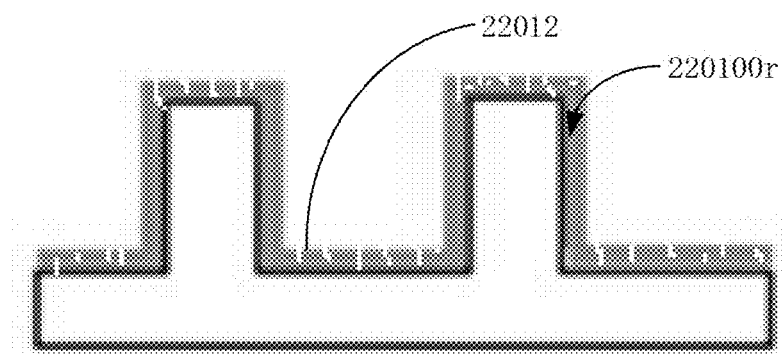

Referring to FIG. 6, FIG. 5B, and FIG. 5C, subsequent to the step 602, the step 603 may include performing a surface roughening treatment on the getter material layer 220100 to form a roughened getter material layer 220100r, wherein protrusions may be formed at a processed side 22012 of the roughened getter material layer 220100r. The surface roughening treatment may include one or more of a dry etching process, a wet etching process, etc.

Figure 5D:
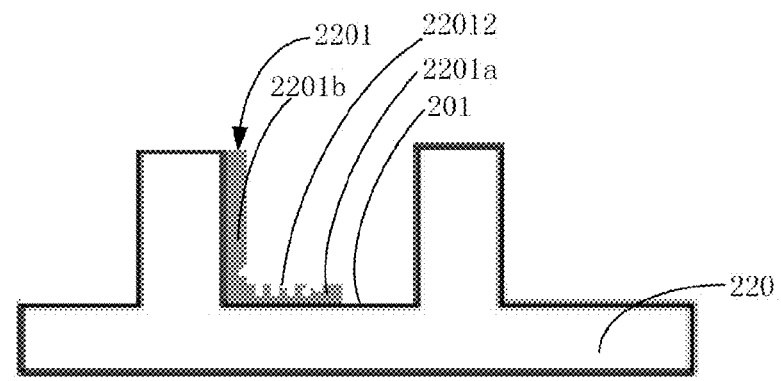
Figure 5E:
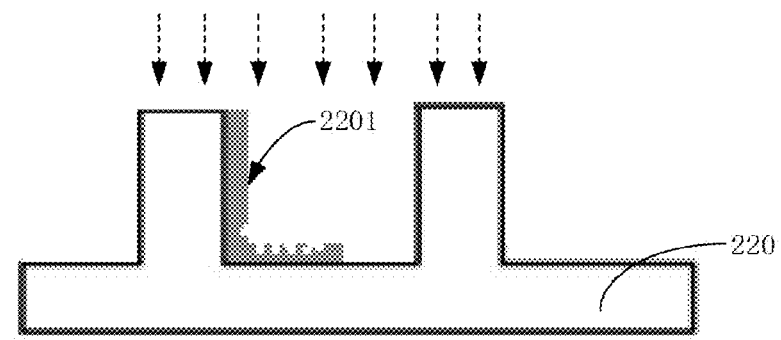
Figure 5F:
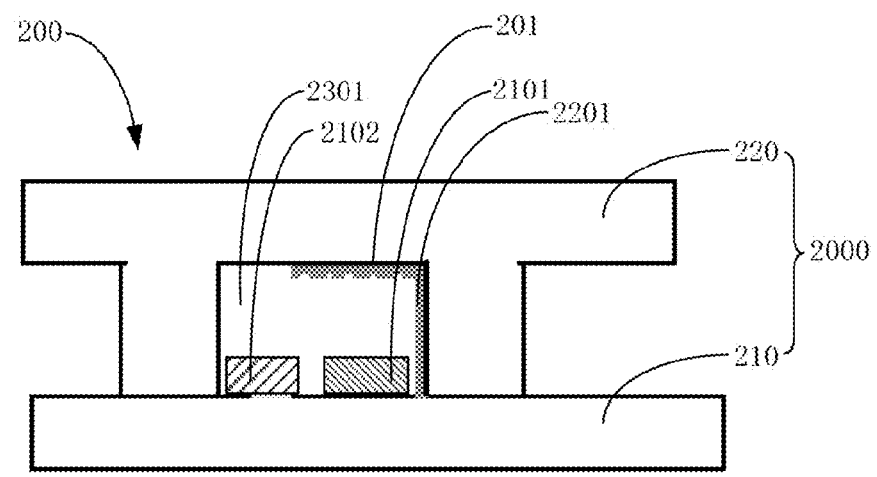

Referring to FIG. 6, FIG. 5C, and FIG. 5D, subsequent to the step 603, the step 604 may include partially removing (e.g., etching) the roughened getter material layer 220100r to form a getter 2201. The etching may include one or more of dry etching, wet etching, etc. The getter 2201 may include a portion 2201a and a portion 2201b. The portion 2201a may overlap (and may directly contact) a first portion of the bottom surface 201 of the trench 2301. The portion 2201a may have at least one roughed side that may have protrusions. The portion 2201b may overlap a side surface of the trench 2301. The portion 2201b may have at least one roughed side that may have protrusions.

Referring to FIG. 6, FIG. 5D, and FIG. 5E, subsequent to the step 604, the step 605 may include performing a cleaning process (represented by the dotted arrows illustrated in FIG. 5E) on at least the substrate structure 220. The cleaning process may remove impurities and/or unwanted materials from the substrate structure 220, for optimizing quality of elements in the substrate structure 220 and/or for facilitating the subsequent bonding (or combination) process.

Referring to FIG. 6, FIG. 5E, and FIG. 5F, subsequent to the step 605, the step 606 may include combining the substrate structure 220 with a substrate structure 210 that includes the getter 2201, an electronic component 2101, and an inductor 2102 to form an enclosure structure 2000 that encloses the getter 2201, the electronic component 2101, and the inductor 2102, such that the inductor 2102 may overlap a second portion of the bottom surface 201 of the trench 2301 without overlapping the getter 2201 in a direction perpendicular to the bottom surface 201 of the trench 2301. The method and the resulted enclosure structure 2000 may have one or more of the features and advantages associated with the semiconductor device 200 discussed above.

According to embodiments of the invention, undesirable coupling between the getter 2201 and the inductor 2102 may be minimized or substantially prevented, molecular absorption capability of the getter 2201 may be optimized, and/or the substrate structures 220 and 201 may be optimally bonded through the bonding material member 222. Advantageously, satisfactory quality of the semiconductor device 200 and satisfactory manufacturing yield associated with the semiconductor device may be substantially attained.

Figure 7:
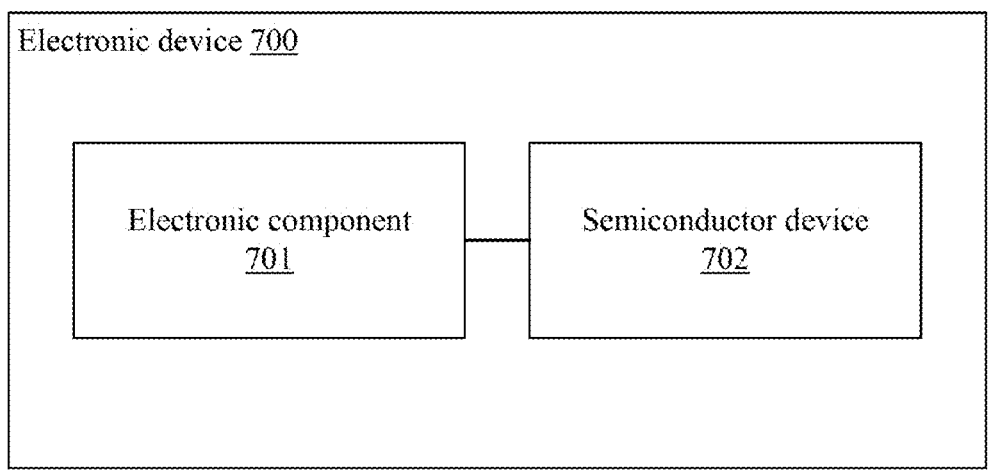
FIG. 7 shows a schematic block diagram that illustrates elements in an electronic device in accordance with one or more embodiments of the present invention.

FIG. 7 shows a schematic block diagram that illustrates elements in an electronic device 700 in accordance with one or more embodiments of the present invention. The electronic device 700 may include an electronic component 701 and a semiconductor device 702 that is electrically connected to the electronic component 701. The semiconductor device 702 may have one or more of the above-discussed features and advantages.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the invention, in semiconductor devices, undesirable coupling between components (e.g., between an inductors and getters) may be minimized or substantially prevented, vacuum may be substantially effectively maintained, and/or substantially robust bonding may be ensured. Advantageously, satisfactory quality of the semiconductor devices and a satisfactory yield of the manufacturing process may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
providing a first substrate structure that has a trench;
providing a getter in the trench, wherein the getter overlaps a first portion of a bottom surface of the trench; and
after the getter has been provided in the trench, combining the first substrate structure with a second substrate structure that includes an inductor, wherein the inductor overlaps a second portion of the bottom surface of the trench without overlapping the getter in a direction perpendicular to the bottom surface of the trench.

2. The method of claim 1, comprising: forming protrusions at a first side of the getter, wherein a second side of the getter is positioned between the first side of the getter and the bottom surface of the trench.

3. The method of claim 1, comprising:
providing a getter material layer that covers a bottom surface of the trench;
performing a roughening treatment on the getter material layer; and
after the roughening treatment, etching the getter material layer to form the getter.

4. The method of claim 3, wherein the getter material layer covers a side surface of the trench, and wherein the getter overlaps the side surface of the trench in a direction perpendicular to the side surface of the trench.

5. The method of claim 1, further comprising: after the getter has been provided in the trench and before the combining the first substrate structure with the second substrate structure, performing a cleaning process on the first substrate structure.

6. The method of claim 1, wherein the first substrate structure includes a substrate member and a mask member connected to the substrate member, wherein the substrate member is formed of a first material, wherein the mask member is formed of a second material different from the first material, and wherein the getter directly contacts both the substrate member and the mask member.

7. The method of claim 1, comprising:
providing a getter material member in the trench, wherein a portion of the getter material member covers a side surface of the trench and a second portion of the bottom surface of the trench; and
removing the portion of the getter material member to obtain the getter.

8. The method of claim 1, comprising:
providing a mask layer on a composite structure that includes a substrate material member, a mask member positioned on the substrate material member, and a bonding material member positioned on the mask member, wherein the mask layer covers at least three sides of the bonding material member;
etching the substrate material member through the mask layer to obtain the first substrate structure, wherein the mask layer exposes the trench;
providing a getter material layer that covers the mask layer and the bottom surface of the trench;
removing the mask layer and a portion of the getter material layer that covers the mask layer to form a getter material member, wherein a first portion of the getter material member covers a second portion of the bottom surface of the trench, wherein a portion of the mask member is positioned between the first portion of the getter material member and a second portion of the getter material member; and
removing at least the first portion of the getter material member and the second portion of the getter material member to obtain the getter.

9. The method of claim 8, wherein the mask layer directly contacts both the mask member and the bonding material member before the mask layer is removed.

* * * * *